US011064583B2

(12) United States Patent
Houser

(10) Patent No.: US 11,064,583 B2
(45) Date of Patent: Jul. 13, 2021

(54) LIGHT SOURCES THAT INCREASE OBJECT CHROMA WHEN DIMMED

(71) Applicant: The Penn State Research Foundation, University Park, PA (US)

(72) Inventor: Kevin Houser, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 16/489,472

(22) PCT Filed: Feb. 15, 2018

(86) PCT No.: PCT/US2018/018297
§ 371 (c)(1),
(2) Date: Aug. 28, 2019

(87) PCT Pub. No.: WO2018/160361
PCT Pub. Date: Sep. 7, 2018

(65) Prior Publication Data
US 2020/0383187 A1 Dec. 3, 2020

Related U.S. Application Data

(60) Provisional application No. 62/608,590, filed on Dec. 21, 2017, provisional application No. 62/466,035, filed on Mar. 2, 2017.

(51) Int. Cl.
*H05B 45/20* (2020.01)
*G09G 3/34* (2006.01)
(Continued)

(52) U.S. Cl.
CPC ............. *H05B 45/20* (2020.01); *H05B 45/10* (2020.01); *H05B 45/395* (2020.01);
(Continued)

(58) Field of Classification Search
CPC ........ H05B 45/00; H05B 45/20; H05B 45/60; H05B 45/39; H05B 45/10; H05B 47/155;
(Continued)

(56) References Cited

U.S. PATENT DOCUMENTS 8,096,675 B1 * 1/2012 Posselt .................. H05B 45/20
362/230
8,177,389 B1 * 5/2012 Kropf ..................... G01J 3/505
362/231

(Continued)

FOREIGN PATENT DOCUMENTS

WO 2015085050 A1 6/2015

OTHER PUBLICATIONS

Tony Esposito, "Modeling Color Rendition and Color Discrimination with Average Fidelity, Average Gamut, and Gamut Shape," Disertation. Pennsylvania State University, Dec. 2016 (https://etda.libraries.psu.edu/files/final_submissions/13628).

(Continued)

*Primary Examiner* — Haissa Philogene
(74) *Attorney, Agent, or Firm* — Riverside Law LLP

(57) ABSTRACT

A method of increasing the color gamut of a multi-emitter light emitting device when dimming includes the steps of independently driving each emitter in the device, and increasing the lumen output of at least one emitter while simultaneously decreasing the lumen output of at least one other emitter, such that total color gamut increases while total lumen output of the light emitting device decreases. A light emitting device is also disclosed.

17 Claims, 21 Drawing Sheets
(13 of 21 Drawing Sheet(s) Filed in Color)

(51) Int. Cl.
*H05B 45/395* (2020.01)
*H05B 47/19* (2020.01)
*H05B 47/155* (2020.01)
*H05B 45/10* (2020.01)
*H01L 25/16* (2006.01)

(52) U.S. Cl.
CPC ......... *H05B 47/155* (2020.01); *H05B 47/19* (2020.01); *H01L 25/167* (2013.01)

(58) Field of Classification Search
CPC ........ H05B 45/395; G01J 3/505; G01J 3/465; G01J 3/463; H01L 21/32; H01L 25/167; H04N 9/3161; H04N 9/3182; G09G 3/3413; G09G 3/32; G09G 3/2003; Y02B 20/30
See application file for complete search history.

(56) References Cited

U.S. PATENT DOCUMENTS

| | | | |
|---|---|---|---|
| 9,134,178 B2* | 9/2015 | Kurtz | H04N 1/58 |
| 9,368,695 B2* | 6/2016 | David | F21K 9/64 |
| 10,076,633 B2* | 9/2018 | Krames | F21V 29/70 |
| 10,413,626 B1* | 9/2019 | Barron | A61L 2/085 |
| 10,605,652 B2* | 3/2020 | Chang | H05B 45/20 |
| 10,683,971 B2* | 6/2020 | Tudorica | F21K 9/66 |
| 10,805,998 B2* | 10/2020 | Petluri | G09G 3/3413 |
| 2008/0164823 A1 | 7/2008 | Huang | |
| 2010/0188022 A1 | 7/2010 | Gerlach | |
| 2014/0197750 A1 | 7/2014 | Cash | |
| 2015/0380460 A1 | 12/2015 | Horie | |
| 2019/0254142 A1* | 8/2019 | Petluri | G09G 3/3413 |

OTHER PUBLICATIONS

Extended European Search Report for App. No. EP18760286.7, dated Oct. 7, 2020, 8 pages.

\* cited by examiner

| | | | | | |
|---|---|---|---|---|---|
| 2 | 1 | 3 | 4 | 3 | 2 |
| 5 | 2 | 7 | 6 | 2 | 1 |
| 4 | 6 | 2 | 4 | 5 | 3 |
| 3 | 7 | 1 | 2 | 6 | 4 |
| 1 | 2 | 5 | 7 | 2 | 3 |
| 2 | 3 | 4 | 3 | 1 | 2 |

| Channel | Full Output | \multicolumn{9}{c}{Dimmed Level} | | | | | | | | | |
|---|---|---|---|---|---|---|---|---|---|---|
| | | 90% | 80% | 70% | 60% | 50% | 40% | 30% | 20% | 10% | 1% |
| 1 | 0.583 | 0.682 | 0.772 | 0.804 | 0.784 | 0.737 | 0.610 | 0.514 | 0.405 | 0.224 | 0.024 |
| 2 | 0.802 | 0.918 | 0.997 | 0.816 | 0.616 | 0.435 | 0.083 | 0.000 | 0.054 | 0.019 | 0.000 |
| 3 | 0.368 | 0.194 | 0.032 | 0.000 | 0.000 | 0.000 | 0.111 | 0.091 | 0.010 | 0.000 | 0.000 |
| 4 | 0.809 | 0.356 | 0.116 | 0.246 | 0.312 | 0.373 | 0.610 | 0.574 | 0.384 | 0.209 | 0.025 |
| 5 | 0.097 | 0.574 | 0.724 | 0.567 | 0.526 | 0.436 | 0.246 | 0.137 | 0.051 | 0.024 | 0.000 |
| 6 | 0.514 | 0.319 | 0.210 | 0.175 | 0.096 | 0.045 | 0.011 | 0.000 | 0.000 | 0.000 | 0.000 |
| 7 | 0.000 | 0.013 | 0.019 | 0.063 | 0.112 | 0.142 | 0.197 | 0.181 | 0.118 | 0.065 | 0.008 |

FIG. 6B

| Channel | Full Output | \multicolumn{9}{c}{Dimmed Level} | | | | | | | | | |
|---|---|---|---|---|---|---|---|---|---|---|
| | | 90% | 80% | 70% | 60% | 50% | 40% | 30% | 20% | 10% | 1% |
| 1 | 149 | 174 | 197 | 205 | 200 | 188 | 155 | 131 | 103 | 57 | 6 |
| 2 | 204 | 234 | 254 | 208 | 157 | 111 | 21 | 0 | 14 | 5 | 0 |
| 3 | 94 | 49 | 8 | 0 | 0 | 0 | 28 | 23 | 2 | 0 | 0 |
| 4 | 206 | 91 | 30 | 63 | 80 | 95 | 155 | 146 | 98 | 53 | 6 |
| 5 | 25 | 146 | 185 | 145 | 134 | 111 | 63 | 35 | 13 | 6 | 0 |
| 6 | 131 | 81 | 54 | 45 | 24 | 11 | 3 | 0 | 0 | 0 | 0 |
| 7 | 0 | 3 | 5 | 16 | 29 | 36 | 50 | 46 | 30 | 17 | 2 |

| | IES TM-30-15 Measures | | | Duv | CCT (K) | LER |
|---|---|---|---|---|---|---|
| | Rf | Rg | Rcs,h1 | | | |
| Full | 96 | 101 | -0.001 | 0.0000 | 3500 | 312 |
| 90% | 91 | 105 | 0.035 | -0.0030 | 3500 | 299 |
| 80% | 86 | 109 | 0.07 | -0.0060 | 3500 | 289 |
| 70% | 82 | 113 | 0.106 | -0.0090 | 3500 | 283 |
| 60% | 77 | 117 | 0.141 | -0.0120 | 3500 | 276 |
| 50% | 72 | 121 | 0.177 | -0.0150 | 3500 | 270 |
| 40% | 67 | 125 | 0.212 | -0.0180 | 3500 | 269 |
| 30% | 62 | 129 | 0.248 | -0.0210 | 3500 | 265 |
| 20% | 58 | 133 | 0.283 | -0.0240 | 3500 | 258 |
| 10% | 53 | 136 | 0.319 | -0.0270 | 3500 | 251 |
| Min. | 48 | 140 | 0.354 | -0.0300 | 3500 | 248 |

FIG. 6C

LIGHT SOURCES THAT INCREASE OBJECT CHROMA WHEN DIMMED

CROSS-REFERENCE TO RELATED APPLICATIONS

This application is a '371 US National Stage Application of PCT/US18/18297, filed Feb. 15, 2018, which claims priority to U.S. Provisional Patent Application No. 62/466,035, filed Mar. 2, 2017, and U.S. Provisional Patent Application No. 62/608,590, filed Dec. 21, 2017, all of which are incorporated herein by reference in their entireties.

BACKGROUND OF THE INVENTION

When conventional light sources are dimmed, color perceptions of the objects being illuminated by the light source become muted (e.g. duller, less saturated, less vivid, and less vibrant). This phenomenon of human vision is known as the Hunt Effect, where at low light levels, objects essentially appear less colorful than at high light levels. For many applications, such as residential lighting, museum lighting, theater lighting, hospitality lighting, and any other application where color perceptions and dimming are important components of the lighting solution, it would be beneficial to compensate for the reduced sensitivity to color as the light source is dimmed.

There are numerous recently introduced LED products that feature a "dim-to-warm" technology. Filament lamps also become warmer when they dim. With "dim-to-warm" LED products, a light source featuring multiple LEDs is independently adjusted so that the correlated color temperature (CCT) of the light source becomes warmer during dimming. However, there is no physiological reason that dim-to-warm should be a preferable or attractive lighting modality to humans. There is, however a physiological reason that "dim-to-vibrant" should be preferable and desirable, namely for overcoming the Hunt Effect.

Thus, what is needed in the art is a device, system and method for counteracting the Hunt Effect and increasing object chroma when the light source is dimmed.

SUMMARY OF THE INVENTION

In one embodiment, a method of increasing the color gamut of a multi-emitter light emitting device when dimming, includes the steps of independently driving each emitter in the device; and increasing the lumen output of at least one emitter while simultaneously decreasing the lumen output of at least one other emitter, such that total color gamut increases while total lumen output of the light emitting device decreases. In one embodiment, the multiple LED emitters include at least 7 LED emitters. In one embodiment, the at least 7 LED emitters include a red emitter, an amber emitter, a lime emitter, a green emitter, a cyan emitter, a blue emitter and an indigo emitter. In one embodiment, the plurality of LED emitters includes at least 4 LED emitters. In one embodiment, the at least 4 LED emitters include a red emitter, a green emitter, a royal blue (indigo) emitter, and a white emitter. In one embodiment, the plurality of LED emitters includes at least 5 LED emitters. In one embodiment, the at least 5 LED emitters include a red emitter, a lime emitter, a green emitter, a cyan emitter, and a royal blue (indigo) emitter.

In one embodiment, the method includes the step of linearly decreasing the IES TM-30-15 fidelity index (Rf) as lumen output decreases. In one embodiment, the method includes the step of linearly decreasing the IES TM-30-15 fidelity index (Rf) from about 96 at full output to about 48 at minimum dimmed level. In one embodiment, the method includes the step of linearly increasing the IES TM-30-15 gamut index (Rg) as lumen output decreases. In one embodiment, the method includes the step of linearly increasing the IES TM-30-15 gamut index (Rg) from about 101 at full output to about 140 at minimum dimmed level. In one embodiment, the method includes the step of linearly decreasing Duv as lumen output decreases. In one embodiment, the method includes the step of linearly decreasing Duv from about 0.0 at full output to about −0.03 at minimum dimmed level. In one embodiment, the method includes the step of linearly increasing the IES TM-30-15 chroma shift in hue bin one (Rcs,h1) as lumen output decreases. In one embodiment, the method includes the step of linearly increasing the IES TM-30-15 chroma shift in hue bin one (Rcs,h1) from about −0.1% at full output to about +35.4% at minimum dimmed level. In one embodiment, the method includes the step of maintaining a constant correlated color temperature as lumen output decreases. In one embodiment, the light emitting device is a luminaire. In one embodiment, the light emitting device is a lamp with an integrated base that can screw into an existing light socket or insert into a pin-base.

In one embodiment, a light emitting device includes at least 2 LED emitters, at least one internal controller, multiple driver circuits configured to independently drive the plurality of LED emitters via the at least one internal controller, and programming logic configured to increase the lumen output of at least one emitter while simultaneously decreasing the lumen output of at least one other emitter, such that total color gamut increases while total lumen output of the light emitting device decreases. In one embodiment, each of the LED emitters is configured to emit a different color. In one embodiment, the at least 2 LED emitters are selected from a group including a red emitter, a lime emitter, an amber emitter, a green emitter, a cyan emitter, a blue emitter, an indigo emitter, and a white emitter. In one embodiment, the light emitting device is further configured to linearly decrease the IES TM-30-15 fidelity index (Rf) as lumen output decreases. In one embodiment, the light emitting device is further configured to linearly decrease the IES TM-30-15 fidelity index (Rf) from about 96 at full output to about 48 at minimum dimmed level. In one embodiment, the light emitting device is further configured to linearly increase the IES TM-30-15 gamut index (Rg) as lumen output decreases. In one embodiment, the light emitting device is further configured to linearly increase the IES TM-30-15 gamut index (Rg) from about 101 at full output to about 140 at minimum dimmed level. In one embodiment, the light emitting device is further configured to increase the IES TM-30-15 gamut index (Rg) to at least 120 at a 50% dimmed level. In one embodiment, the light emitting device is further configured to linearly decrease Duv as lumen output decreases. In one embodiment, the light emitting device is further configured to linearly decrease Duv from about 0.0 at full output to about −0.03 at minimum dimmed level. In one embodiment, the light emitting device is further configured to linearly increase the IES TM-30-15 chroma shift in hue bin one (Rcs,h1) as lumen output decreases. In one embodiment, the light emitting device is further configured to linearly increase the IES TM-30-15 chroma shift in hue bin one (Rcs,h1) from about −0.1% at full output to about +35.4% at minimum dimmed level. In one embodiment, the light emitting device is further configured to maintain a constant correlated color temperature as lumen output decreases. In one embodiment, each of the multiple LED emitters comprises an LED die. In one embodiment, the multiple LED emitters are arranged in a single LED package. In one embodiment, the light emitting device is a luminaire. In one embodiment, the light emitting device further comprises an external controller interface communicatively connected to an external controller and the internal controller.

In another aspect, a light emitting device comprises at least 2 LED emitters and a plurality of driver circuits configured to independently drive the plurality of LED emitters, wherein the light emitting device emits light at a first fixed output level, the output level having a lower total lumen output and a higher total color gamut than would be emitted if all the LED emitters were driven equally. In one embodiment, the light emitting device is also configured to emit light at a second fixed output level, the second fixed output level having a lower total lumen output and a higher total color gamut than the first fixed output level. In one embodiment, the light emitting device is configured to emit light at an ordered set of fixed output levels, and each subsequent fixed output level in the set has a lower total lumen output and a higher total color gamut than all previous fixed output levels in the set.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing purposes and features, as well as other purposes and features, will become apparent with reference to the description and accompanying figures below, which are included to provide an understanding of the invention and constitute a part of the specification, in which like numerals represent like elements, and in which:

FIG. 4A is a diagram of a 36-LED array according to one embodiment.

FIG. 6A is a table showing the fractional (i.e. relative) percentages of each of the seven LED channels used to create systematic variations in color characteristics.

FIG. 6B is a table showing relative DMX values associated with the fractional values given in the table of 6A. FIG. 6C is a table and FIG. 6D is a graph showing systematic changes in Rf, Rg, CCT, Duv, and Rcs,h1 from full output to the minimum dimmed level in 10% increments.

DETAILED DESCRIPTION OF THE INVENTION

Figure 1:
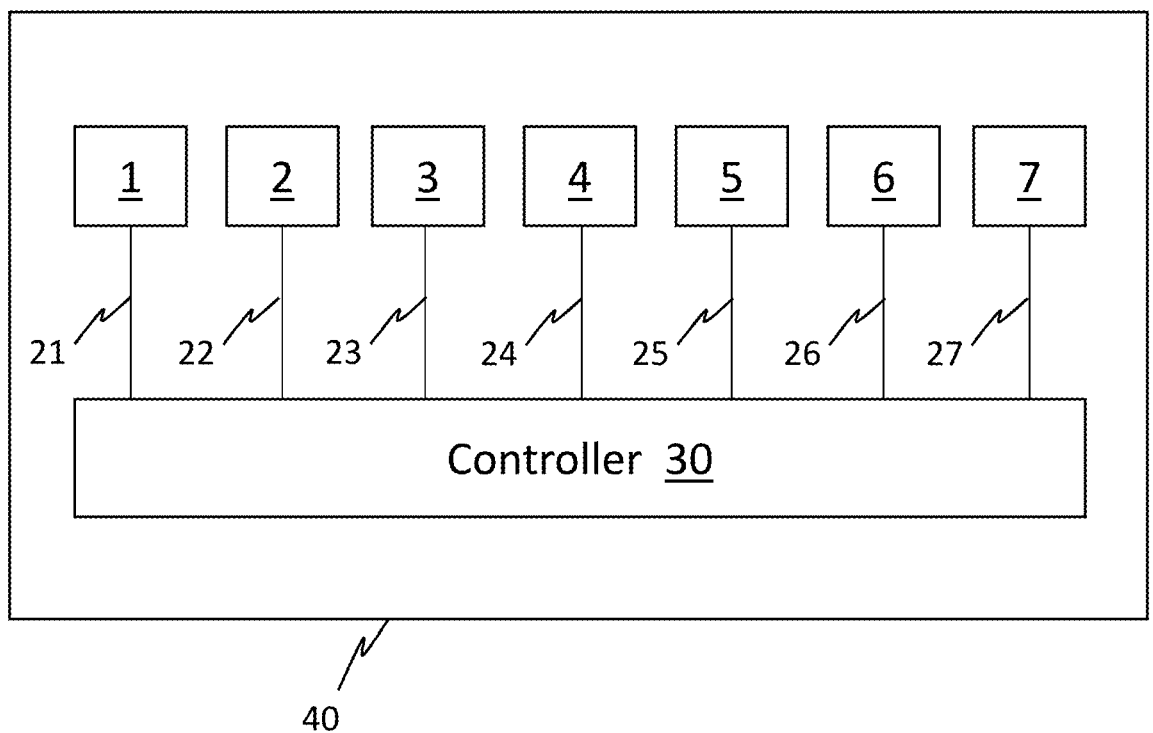
FIG. 1 is a system diagram of a light emitting device according to one embodiment.

It is to be understood that the figures and descriptions of the present invention have been simplified to illustrate elements that are relevant for a more clear comprehension of the present invention, while eliminating, for the purpose of clarity, many other elements found in systems and methods of increasing object chroma when dimming a light source. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Referring now in detail to the drawings, in which like reference numerals indicate like parts or elements throughout the several views, in various embodiments, presented herein are light sources that increase object chroma when dimmed.

With reference now to FIG. 1, an exemplary light emitting device 40 is shown according to one embodiment. The light emitting device 40 includes multiple LED emitters 1, 2, 3, 4, 5, 6, 7 that are each respectively connected to a driver circuit 21, 22, 23, 24, 25, 26, 27. Each driver circuit 21, 22, 23, 24, 25, 26, 27 is connected to an internal controller 30 that is configured to drive each respective LED emitter 1, 2, 3, 4, 5, 6, 7 independently. The internal controller 30 individually manipulates power to each LED 1, 2, 3, 4, 5, 6, 7 as the light emitting device 40 transitions between full output and minimum dimmed levels. It should be appreciated that there is no limitation to the exact number of emitters, for example, the device might include two or more emitters, or might include two or more emitters of at least two different colors of light. The device can also include multiple emitters with groups of two or more emitters emitting the same color of light.

In some embodiments, the device comprises one or more phosphor-converted LEDs (PC-LEDs). A PC-LED is known in the art as an LED emitter having a peak emission wavelength and also including one or more phosphors, wherein the one or more phosphors converts some of the light emitted to a longer wavelength. In some embodiments, the combination of emitters and phosphors is capable of producing a broad spectral emission with a high color-fidelity score. In one embodiment, the combination of emitters and phosphors is capable of creating a spectral emission with an IES TM-30-15 Rf fidelity score greater than 90. In one embodiment, the invention comprises one blue emitter and two narrow-emitting phosphors, one in the green range (with a peak wavelength of about 530 nm) and one in the red range (with a peak wavelength of about 630 nm).

The internal controller 30 can be a hardwired circuit that automatically adjusts power driven to each LED emitter 1, 2, 3, 4, 5, 6, 7 at various levels of lumen output. The internal controller 30 can also be a digital component including a chip that is programmable to control how power is driven individually to each LED emitter 1, 2, 3, 4, 5, 6, 7 at various levels of lumen output. Thus, the internal controller can include computer logic to individually manipulate the output of the emitters. The logic can operate on a computer platform, such as a local or remote executable software platform, or as a hosted Internet or network program or portal. Any computing device as would be understood by those skilled in the art may be used with the system to drive emitter signals, including desktop or mobile devices, laptops, desktops, tablets, smartphones or other wireless digital/cellular phones, or other devices as would be understood by those skilled in the art. The light emitting device 40 is configured to independently drive power to the multiple LED emitters to increase gamut as overall lumen output of the device decreases during the process of dimming.

In some embodiments, the light emitting device 40 further includes at least one external controller interface, configured to communicate with an external controller. Examples of external controllers for use with the external controller interface include, but are not limited to, commercially-available controllers that are already in widespread use. For example, an external controller interface of the present invention might connect to a 0-10V wall-box dimmer, a DMX512 controller, a DALI controller, a wireless lighting controller, a smart home controller, an ambient light sensor, a daylight photocell sensor, or a time clock. In these embodiments, the external controller interface serves as a bridge between the internal controller, which sets the relative intensities of the various LED emitters of the device, and the external controller, which in some embodiments includes a human interface such as a switch, a dimmer switch, or voice control.

Figure 2A:
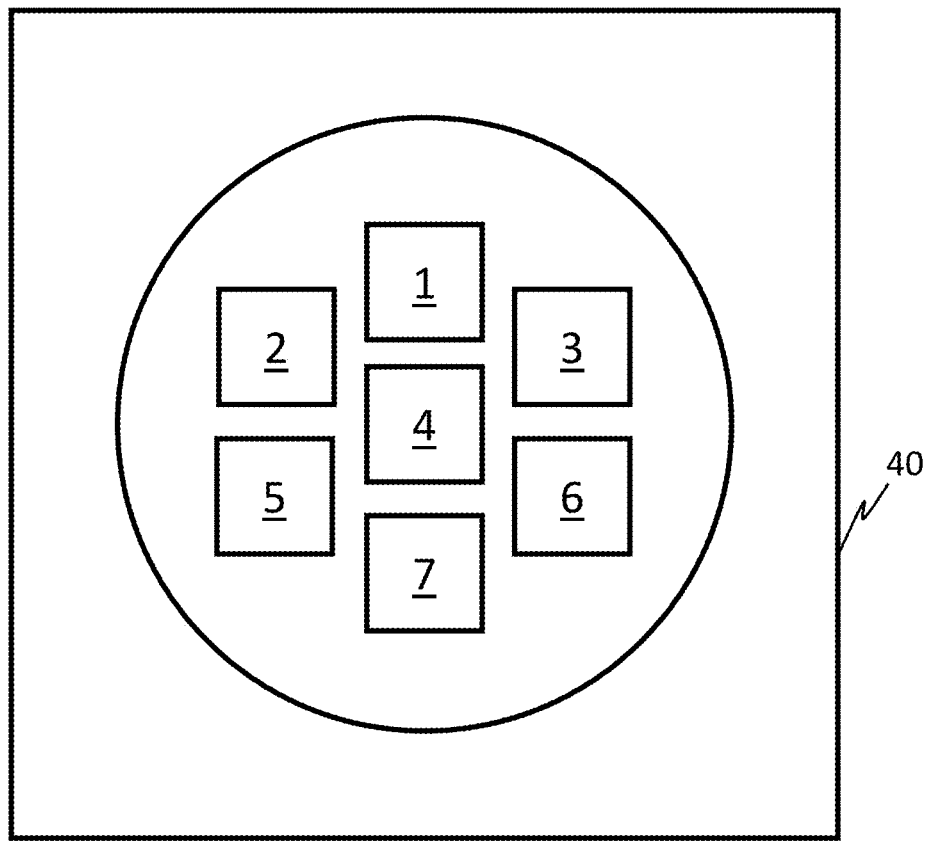
FIG. 2A is a diagram of a 7-LED array according to one embodiment.
Figure 2B:
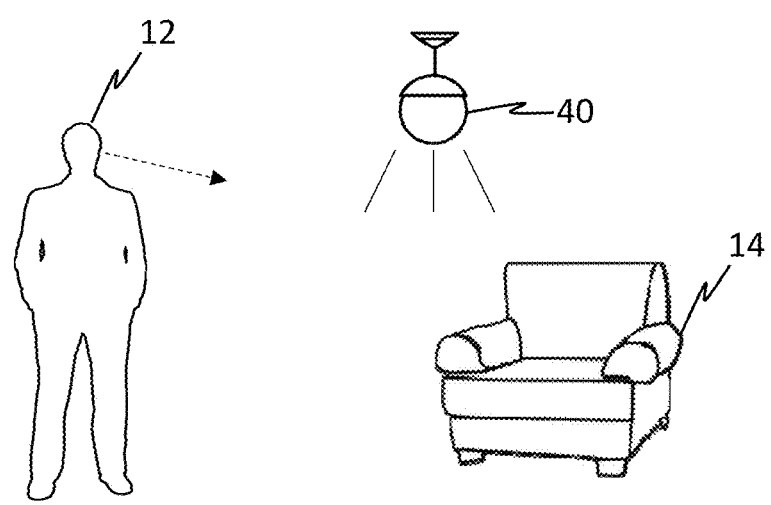
FIG. 2B is an illustration of the light emitting device in a room environment.

In one embodiment, each of the LED emitters 1, 2, 3, 4, 5, 6, 7 is configured to emit a different color, however, certain embodiments may include one or more sets of LED emitters that are the same color. In one embodiment, at least 4 LED emitters emit different colors, while in another embodiment, at least 7 LED emitters emit different colors. With reference now to FIG. 2A, in an embodiment where at least 7 LED emitters emit different colors, an LED array is shown where colors and peak wavelengths include a red emitter (630 nm) 1, an amber emitter (590 nm) 2, a lime emitter (568 nm) 3, a green emitter (530 nm) 4, a cyan emitter (500 nm) 5, a blue emitter (460 nm) 6 and a royal blue (indigo) emitter (445 nm) 7. The emitters can be for example part of an LED package containing the seven LED array. As would be understood by one skilled in the art, the wavelengths listed above are only one example of a possible combination of emitters and are not meant to be exclusive. In some embodiments, for example, the red emitter may have a peak wavelength of 640 nm. In other embodiments, the 7 emitters may include a white emitter with multiple peak wavelengths. The wattage or power supplied to each emitter is independently controlled by a digital controller or a control circuit as described above. For illustrative purposes, the light emitting device 40 of FIG. 2A is shown in an environment depicted in FIG. 2B as an overhead room light 40 illuminating an object 14 that is being observed by a person 12.

In certain embodiments, one or more LED packages are configured on a printed circuit board or substrate. A single internal controller or control circuit can be used to control multiple LED arrays, for example by using a common driver circuit to control the same colored LEDs found in different arrays. The emitters can be any of the various types known in the art, such as for example emitters known by the trade name of Luxeon Rebel (Lumileds Holding B.V.). In certain embodiments, the emitters include an organic material and are OLED emitters. In certain embodiments, the one or more internal controllers and the one or more LED packages are disposed on the same substrate. In certain embodiments, the emitters are configured as a liquid crystal on silicon (LCoS) lighting device. In certain embodiments, the emitters are laser diodes. In certain embodiments, the one or more LED packages are PC-LEDs.

Figure 3:
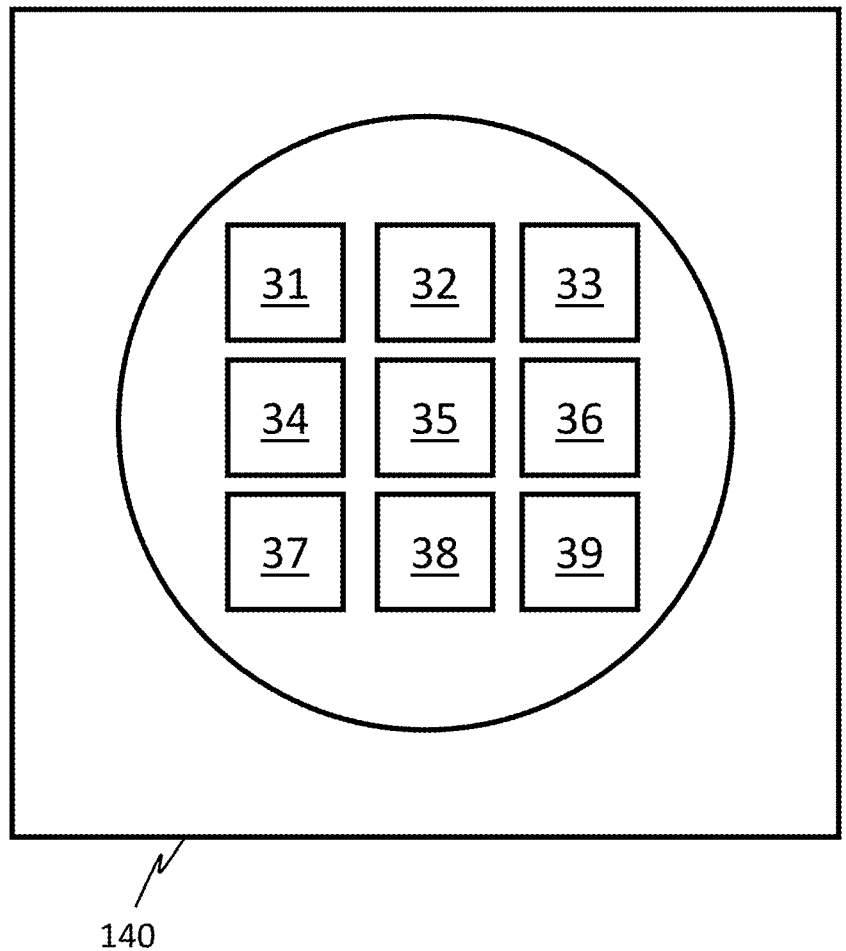
FIG. 3 is a diagram of a 9-LED array according to one embodiment.

The physical arrangement of emitters within the array can take various forms. Arrangements can for example be symmetrical or asymmetrical. With reference now to FIG. 3, a light emitting device 140 is shown having nine LED emitters 31, 32, 33, 34, 35, 36, 37, 38, 39. In this example, the arrangement of the dies is three in-line rows and columns, versus the offset arrangement shown in FIG. 2A. In addition, the embodiment shown in FIG. 3 includes emitters of the colors and peak wavelengths of deep-red (650 nm) 31, red (620 nm) 32, red-orange (610 nm) 33, amber (585 nm) 34, lime (566 nm) 35, green (520 nm) 36, cyan (490 nm) 37, blue (460 nm) 38, and violet (420 nm) 39. As with embodiments described above, the power driven to each die by the internal controller or control circuit is independent of the others.

In one embodiment having at least four LED emitters emitting different colors, the LED array may include emitters with peak wavelengths of red (630 nm), lime (568 nm), green (530 nm), royal blue or indigo (445 nm), and white, having a broad phosphor converted emission. In another embodiment where at least five LED emitters emit different colors, the LED array may include emitters with peak wavelengths of red (630 nm), lime (568 nm), green (530 nm), cyan (500 nm), and royal blue or indigo (445 nm).

Another example of an LED array is shown in FIG. 4A. In this example, the emitters are unequal in number to balance for different lumen outputs. The power driven to each emitter is controlled independently. In this example, the emitters include the colors red (1), amber (2), lime (3), green (4), cyan (5), blue (6), and royal blue (indigo) (7). The example of FIG. 4A comprises five red emitters, ten amber emitters, seven lime emitters, five green emitters, three cyan emitters, three blue emitters, and three royal blue (indigo) emitters.

Figure 4B:
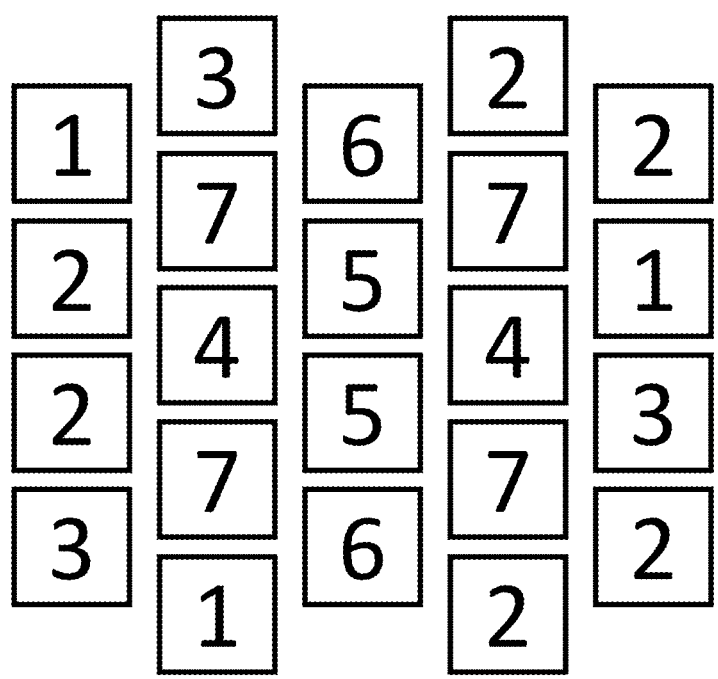
FIG. 4B is a diagram of a 22-LED array according to one embodiment.

Another example of an LED array is shown in FIG. 4B. In this example, 22 emitters are used in a substantially round configuration. The colors corresponding to each number 1-7 in FIG. 4B are red (1), amber (2), green (3), cyan (4), blue (5), royal blue (indigo) (6), and white (7).

There are two primary advantages to this configuration. First, adding more emitters to a package increases the maximum lumen output possible by the package as a whole. Second, emitters of the same type but of a different color will often have different maximum lumen outputs, due to differences in efficiency and in the underlying chemistry necessary to produce light of the required spectral range. One can compensate for the variation in efficiency by using more emitters of lower efficiency to reach the same total luminous output as fewer emitters of higher efficiency.

Figure 5A:
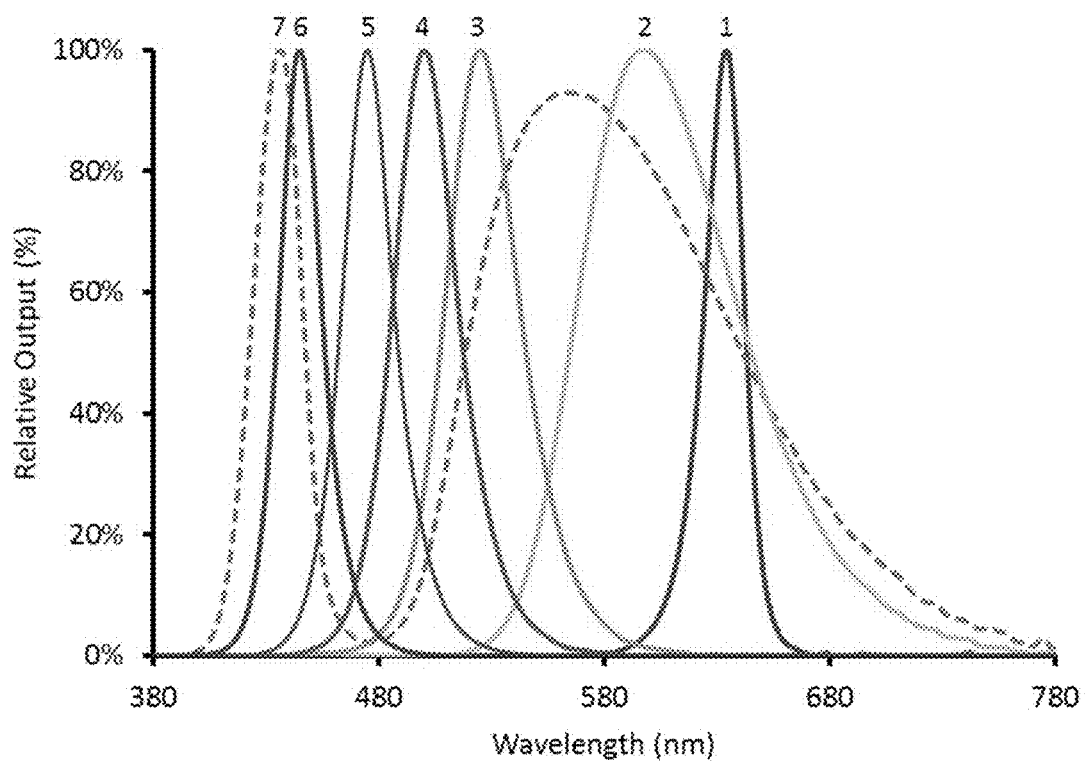
FIG. 5A is a linear graph of peak wavelengths of seven emitters used in one embodiment of the invention.

One example of emitter color distribution is shown in FIG. 5A. The individual SPDs of seven emitters are shown. In FIG. 5A, the curves are numbered as follows, with the corresponding peak wavelengths: 1) Red (634 nm), 2) Amber (597 nm), 3) Green (525 nm), 4) Cyan (500 nm), 5) Blue (475 nm), 6) Royal Blue (Indigo) (445 nm), and 7) White (564 and 436 nm). The SPDs of FIG. 5A are normalized to show the shape of each curve, so that the peak emission wavelength of all curves are shown at the same level. This is not meant to indicate that all seven LED dies are emitting light at the same luminous power level.

Figure 5B:
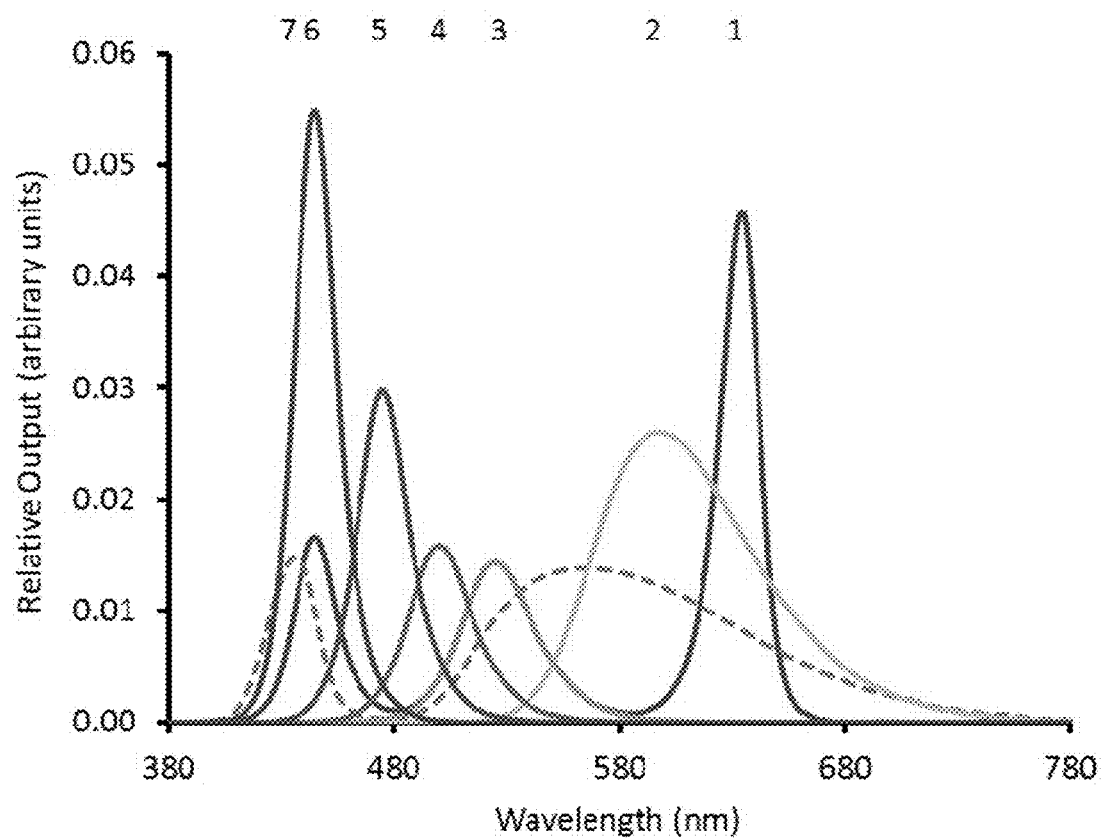
FIG. 5B is a graph of relative spectral power distributions of seven emitters used in one embodiment of the invention.

FIG. 5B shows an alternative representation of the SPDs of the seven emitters indicated above in the description of FIG. 5A. Each curve in FIG. 5B represents the total relative radiant watts generated by each group of emitters with the peak wavelengths indicated above in the description of FIG. 5A, and arranged as in the set of 22 emitters shown in FIG. 4B.

By adjusting the power driven to the various emitters, systematic variations in color characteristics are created in order to increase the gamut index of the light source (hereinafter "Rg"). The invention does so while systematically controlling changes to the fidelity index (hereinafter "Rf"), correlated color temperature (hereinafter "CCT"), "Duv", (which is understood in the art to be a metric that quantifies the distance between the chromaticity of a given light source and a black body radiator of equal CCT), and chroma shift in hue bin 1 (hereinafter "Rcs,h1"). The systematic control of these variables counteracts the Hunt effect and increases object chroma during dimming according to embodiments of the invention. Fractional (i.e. relative) percentages of each of the various LED channels are used to create systematic variations in color characteristics. In one embodiment, the light emitting device is configured to limit the decrease in the IES TM-30-15 fidelity index (Rf) as lumen output decreases. In one embodiment, the light emitting device is configured specifically to limit the decrease in the IES TM-30-15 fidelity index (Rf) from about 96 at full output to about 48 at minimum dimmed level. In one embodiment, the light emitting device is configured to linearly increase the IES TM-30-15 gamut index (Rg) as lumen output decreases. In one embodiment, the light emitting device is configured specifically to linearly increase the IES TM-30-15 gamut index (Rg) from about 101 at full output to about 140 at minimum dimmed level. In one embodiment, the light emitting device is configured to linearly decrease Duv as lumen output decreases. In one embodiment, the light emitting device is configured specifically to linearly decrease Duv from about 0.0 at full output to about −0.03 at minimum dimmed level. In other embodiments, the light emitting device is configured to hold Duv nearly or completely constant. In some embodiments, the light emitting device is configured to hold CCT approximately or completely constant. In other embodiments, the light emitting device is configured to change both CCT and gamut, independently or in parallel. In one embodiment, the light emitting device is configured to linearly increase the IES TM-30-15 chroma shift in hue bin one (Rcs,h1) as lumen output decreases. In one embodiment, the light emitting device is configured specifically to linearly increase the IES TM-30-15 chroma shift in hue bin one (Rcs,h1) from about −0.1% at full output to about +35.4% at minimum dimmed level. In one embodiment, the light emitting device is configured to maintain a constant correlated color temperature as lumen output decreases. These systematic changes increase object chroma during dimming, and this is demonstrated in the experimental examples described in further detail below.

The light emitting device can be any type of light emitting device known in the art for illuminating objects or a general space. In one embodiment, the light emitting device is a luminaire such as a lamp, or a light fixture such as overhead room lighting. In another embodiment, the light emitting device is packaged into a replacement bulb that can screw into an existing light socket or insert into a pin-base. The LED module can be incorporated into luminaires, or be a luminaire inclusive of housing and circuitry. The light emitting device can be used in various applications, such as residential, commercial, museum, theater and hospitality lighting.

Advantageously, embodiments of the invention manipulate the relative proportions of optical radiation at different wavelengths (i.e. the spectral power distribution) to alter the appearance of illuminated objects. At high output (100%) the color gamut of the spectral power distribution will be comparable to a reference illuminant, which has a gamut index (e.g., IES Rg, GAI) of about 100. As the light source is dimmed, not only will lumen output decrease, but the gamut will increase (e.g., IES Rg>100).

In some embodiments, the internal controller of the present invention may include or be replaced by a single, fixed output configuration or a set of fixed output levels that accomplish the wider spectral emission at a lower relative light output of the present invention. For example, in one embodiment, a light emitting device of the present invention will have only "on" and "off" states, but while in the "on" state, the light emitting device will have a lower total lumen output than a reference illuminant, while also having a larger gamut (e.g., IES Rg>100). In exemplary embodiments, an emitter in the "on" state will have a fixed output as shown in FIG. 7H, 7I, or 7J. Alternatively, the fixed output state of an emitter of the present invention may be defined by any single column in FIG. 6A or 6B. It is understood that the embodiments shown in FIGS. 6A, 6B, 7H, 7I, and 7J are not meant to be limiting, and that a fixed output embodiment of a light emitting device of the present invention may have any fixed output wherein the total lumen output is lower than a reference illuminant (i.e. dim), but the total color gamut output will be higher than normal, in order to show illuminated objects in a wider, more radiant color gamut. Embodiments of the present invention may alternatively have a fixed set of output levels, wherein the output level decreases and the color gamut increases in steps rather than continuously.

In one embodiment, a method of generating light output from a light emitting device includes the steps of independently driving multiple LED emitters to increase gamut as lumen output decreases. In one embodiment, the method includes the step of limiting the decrease in the IES TM-30-15 fidelity index (Rf) as lumen output decreases. In one embodiment, the method includes the step of limiting the decrease in the IES TM-30-15 fidelity index (Rf) from about 96 at full output to about 48 at minimum dimmed level. In one embodiment, the method includes the step of linearly increasing the IES TM-30-15 gamut index (Rg) as lumen output decreases. In one embodiment, the method includes the step of linearly increasing the IES TM-30-15 gamut index (Rg) from about 101 at full output to about 140 at minimum dimmed level. In one embodiment, the method includes the step of linearly decreasing Duv as lumen output decreases. In one embodiment, the method includes the step of linearly decreasing Duv from about 0.0 at full output to about −0.03 at minimum dimmed level. In one embodiment, the method includes the step of linearly increasing the IES TM-30-15 chroma shift in hue bin one (Rcs,h1) as lumen output decreases. In one embodiment, the method includes the step of linearly increasing the IES TM-30-15 chroma shift in hue bin one (Rcs,h1) from about −0.1% at full output to about +35.4% at minimum dimmed level. In one embodiment, the method includes the step of maintaining a constant correlated color temperature as lumen output decreases.

Experimental Examples

The invention is now described with reference to the following Examples. These Examples are provided for the purpose of illustration only and the invention should in no way be construed as being limited to these Examples, but rather should be construed to encompass any and all variations which become evident as a result of the teaching provided herein.

Without further description, it is believed that one of ordinary skill in the art can, using the preceding description and the following illustrative examples, make and utilize the present invention and practice the claimed methods. The following working examples therefore, specifically point out the preferred embodiments of the present invention, and are not to be construed as limiting in any way the remainder of the disclosure.

Figure 6D:
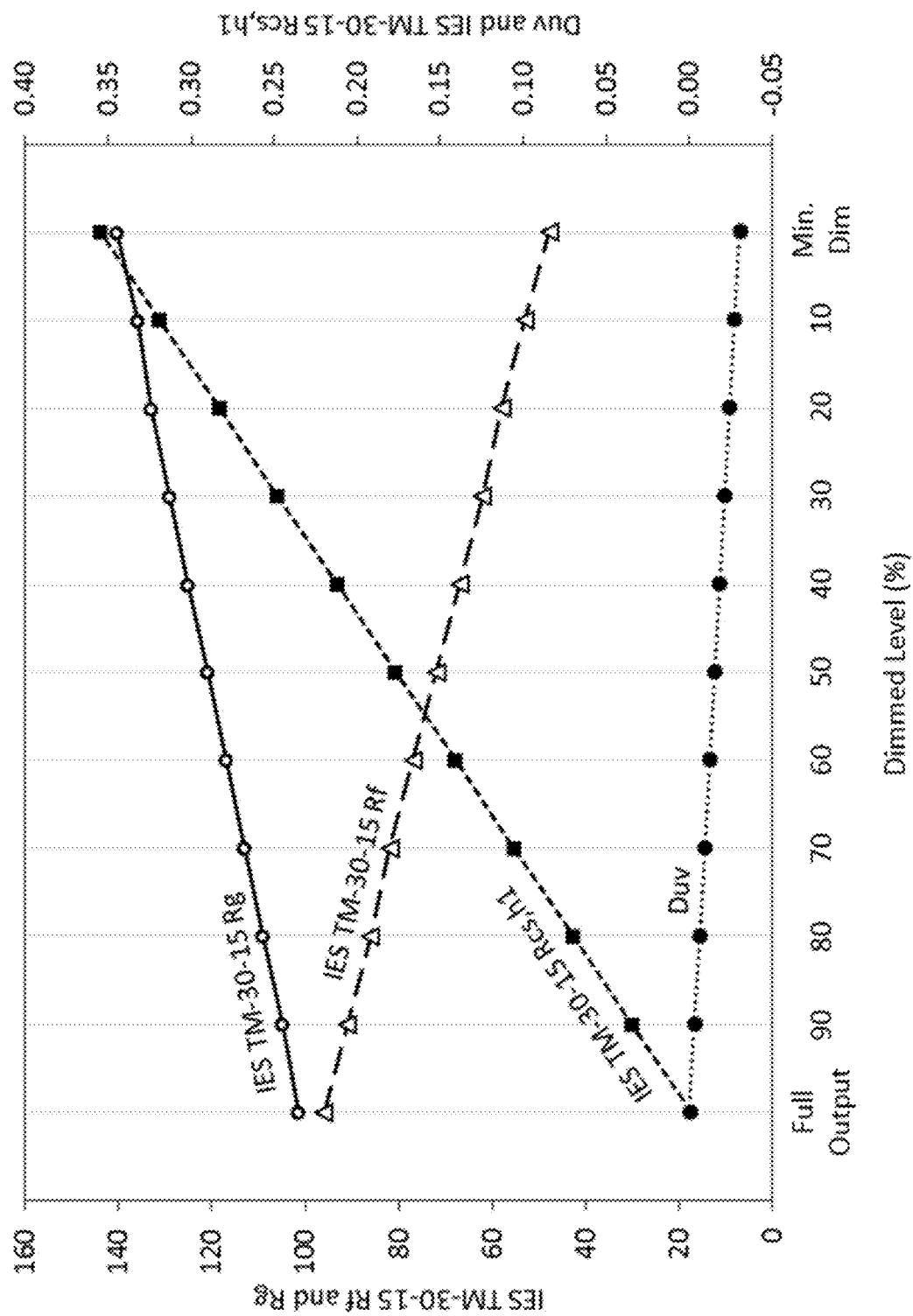
Figure 7A:
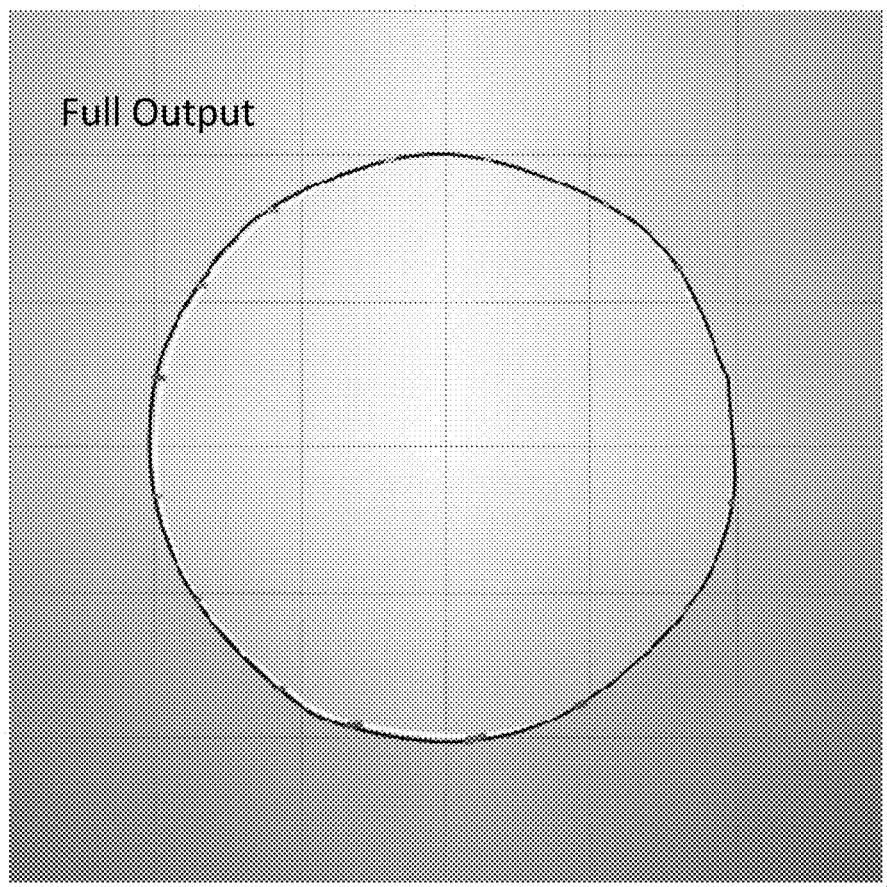
FIGS. 7A-7K show TM-30-15 Color Vector Graphics (CVGs) [top] and associated Spectral Power Distributions (SPDs) [bottom] for dimming from full output to minimum dim level in increments of 10 percent.
Figure 7A:
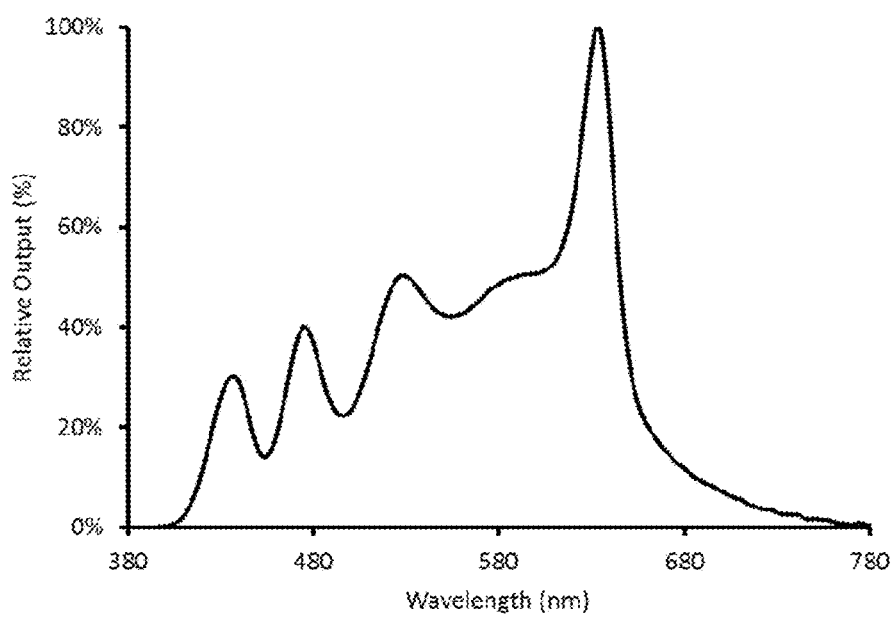
Figure 7B:
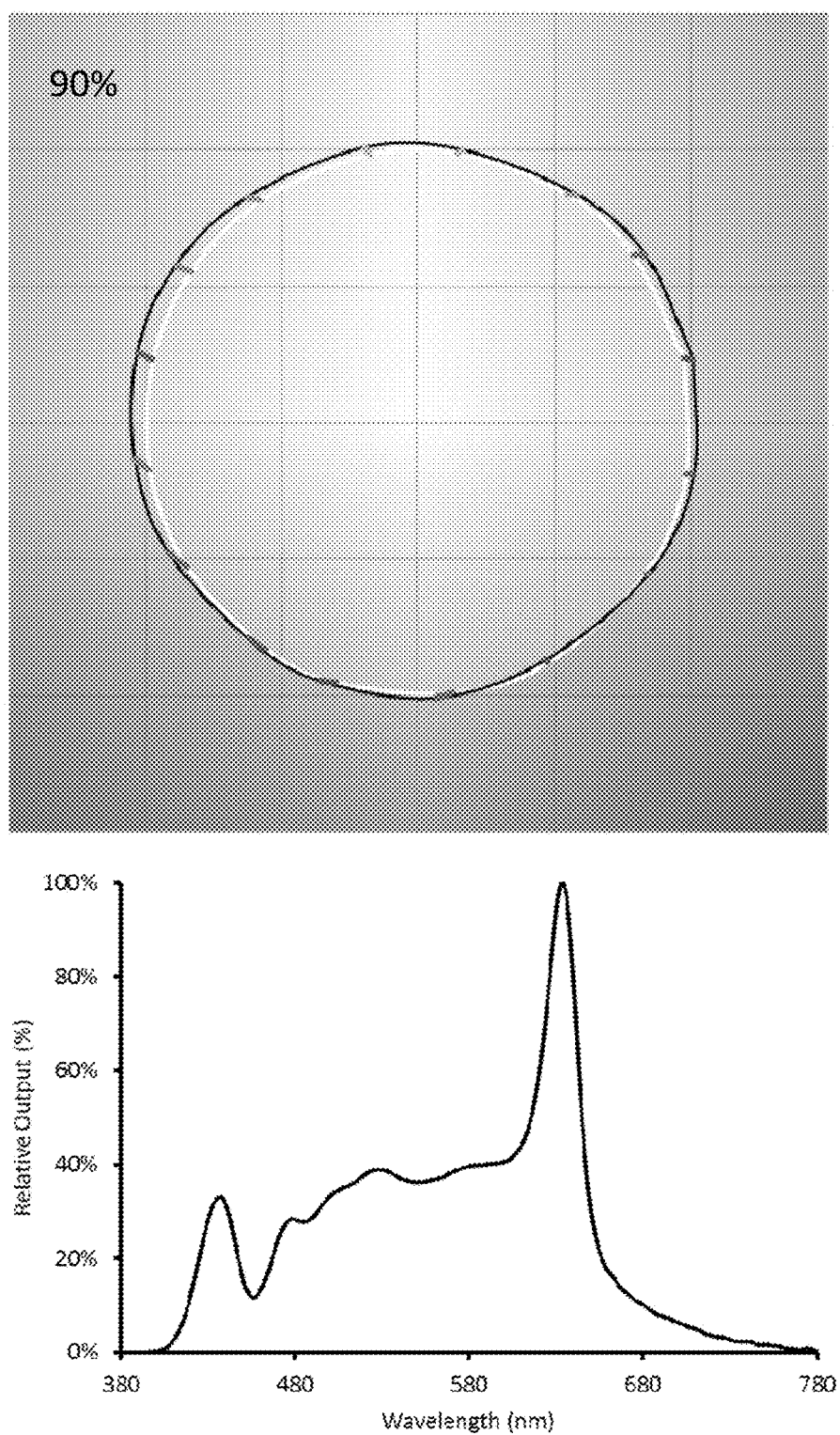
Figure 7C:
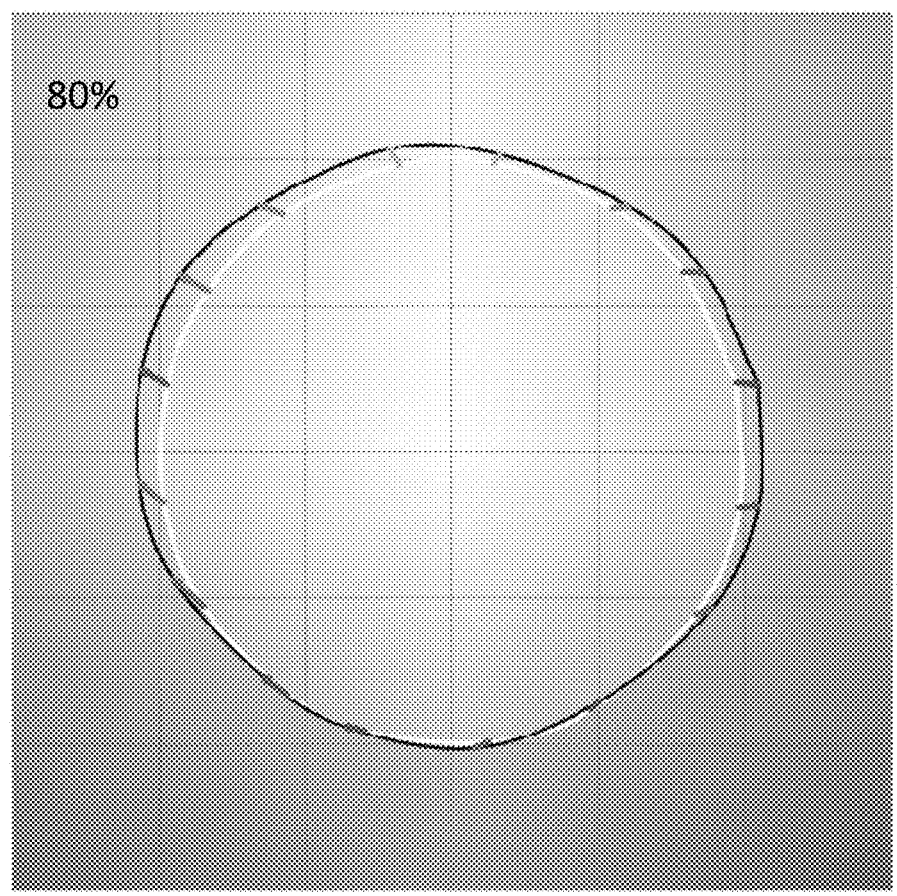
Figure 7C:
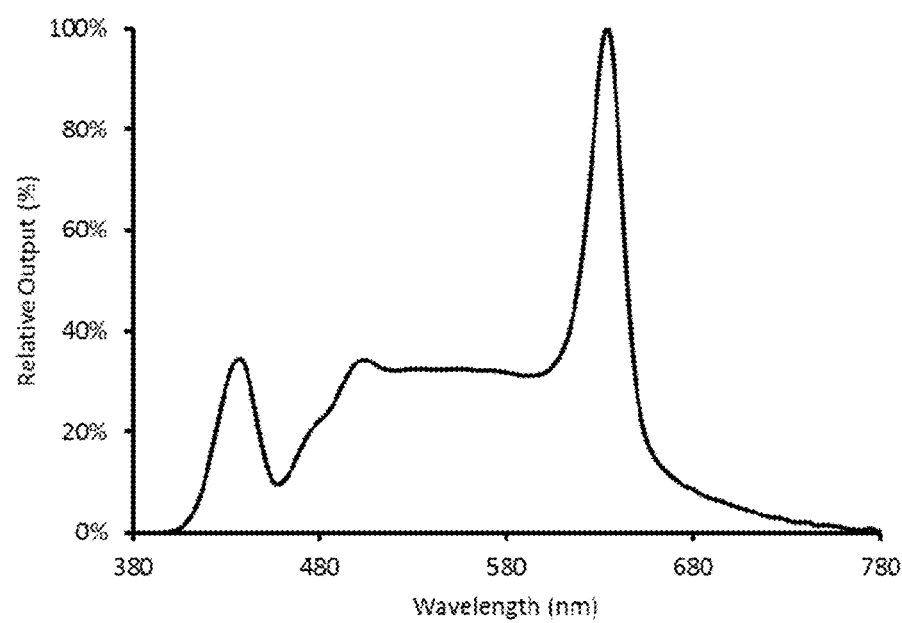
Figure 7D:
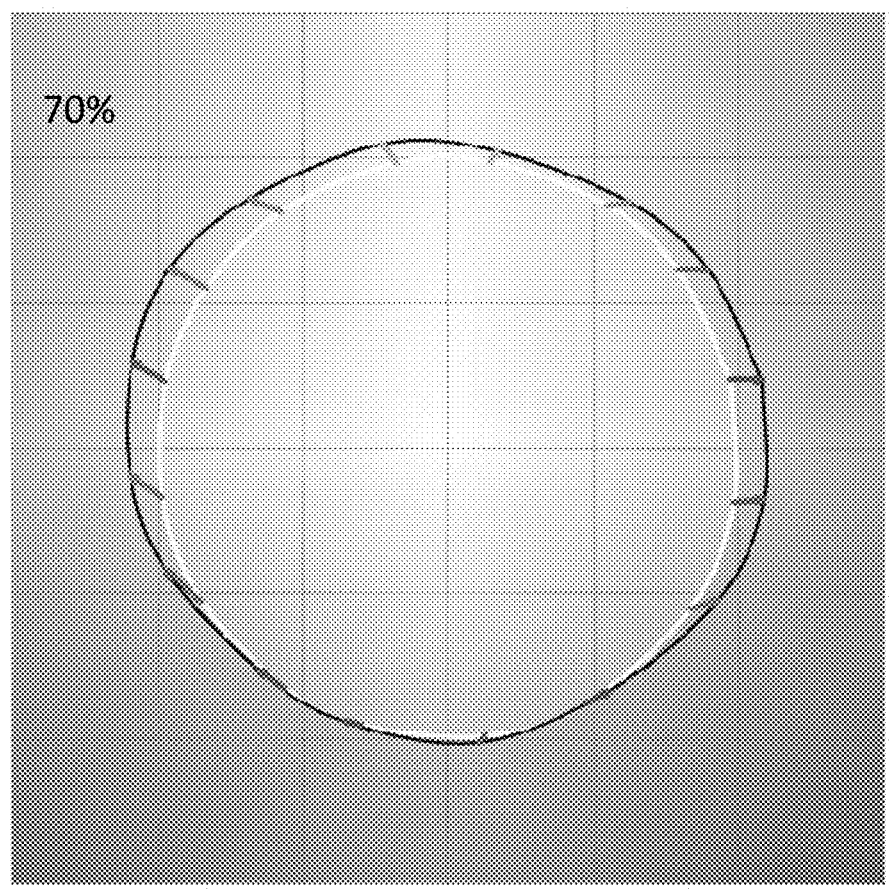
Figure 7D:
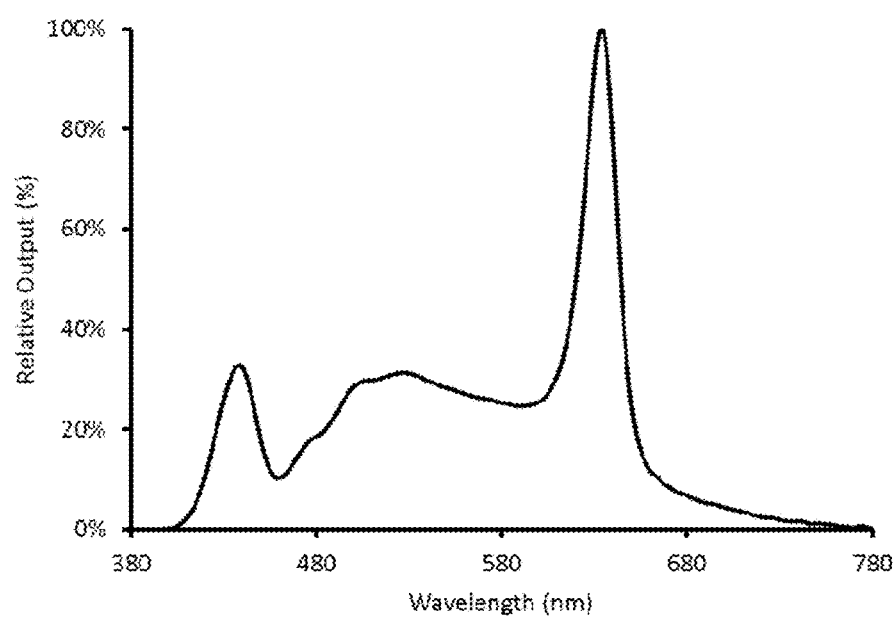
Figure 7E:
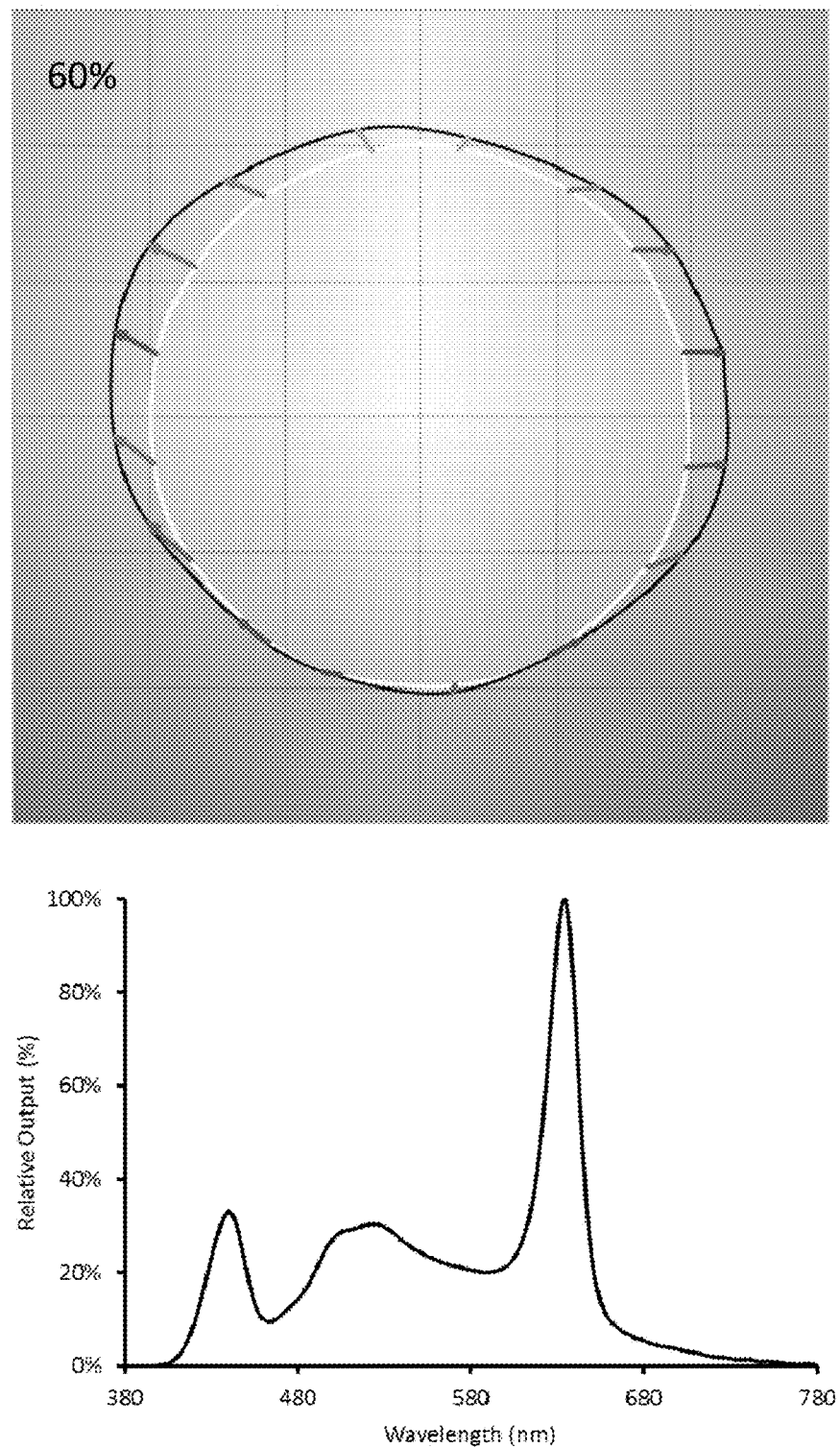
Figure 7F:
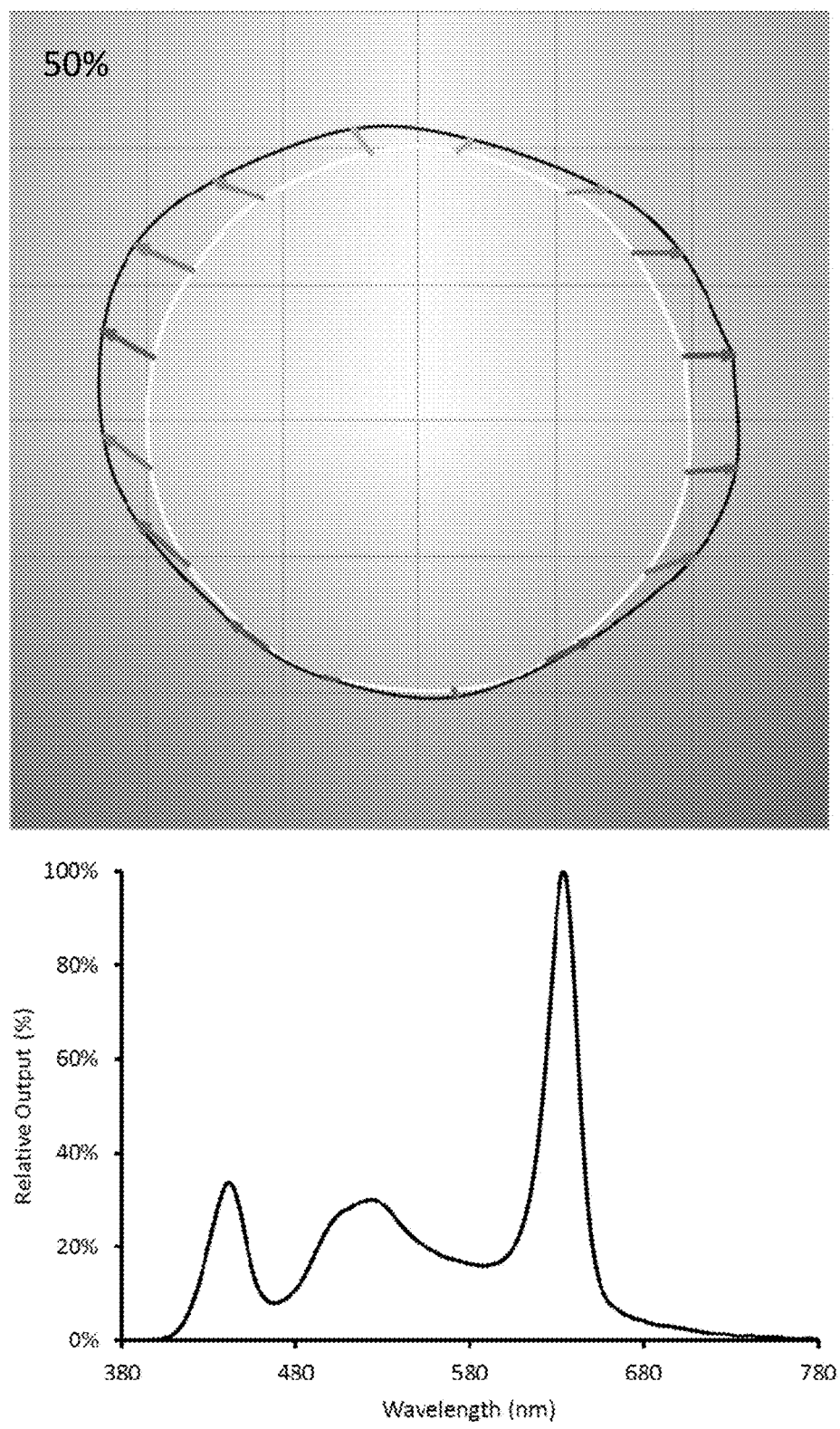
Figure 7G:
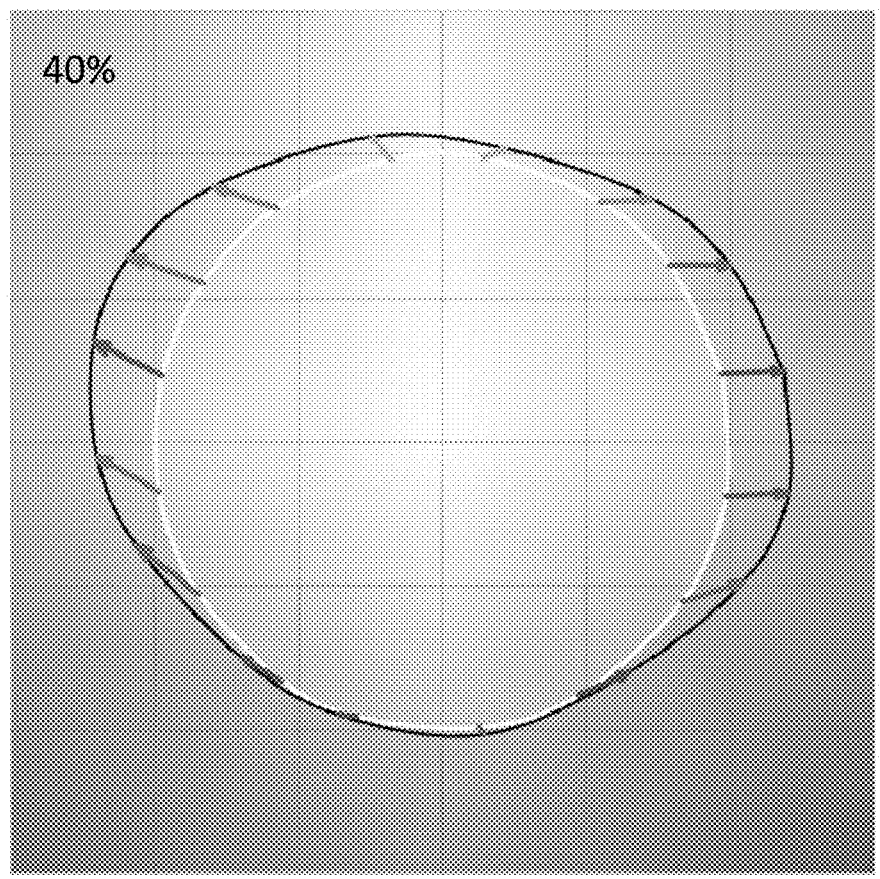
Figure 7G:
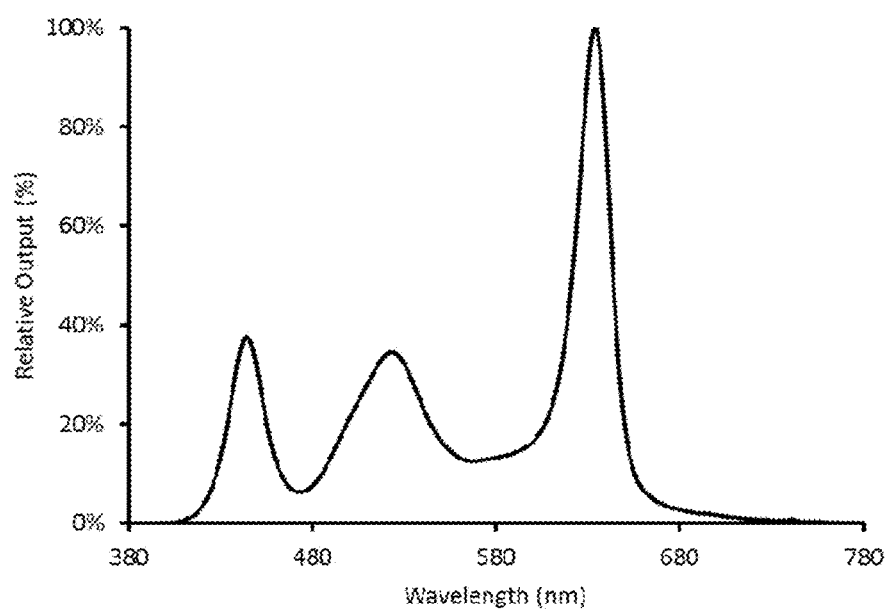
Figure 7H:
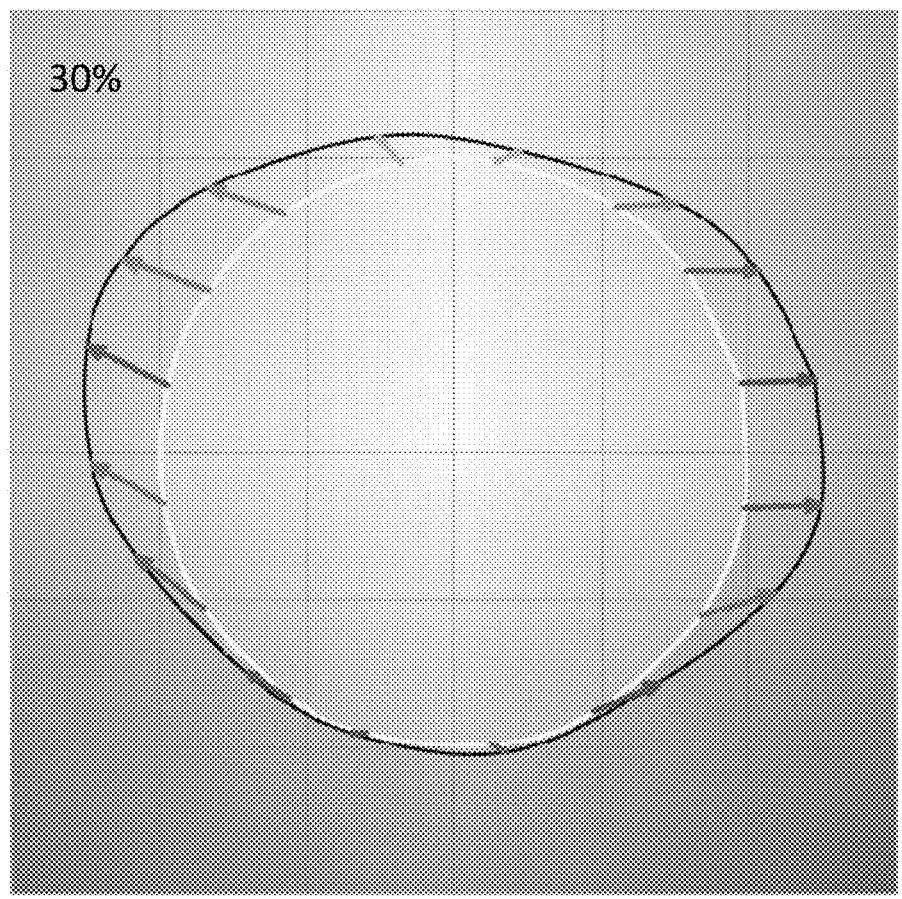
Figure 7H:
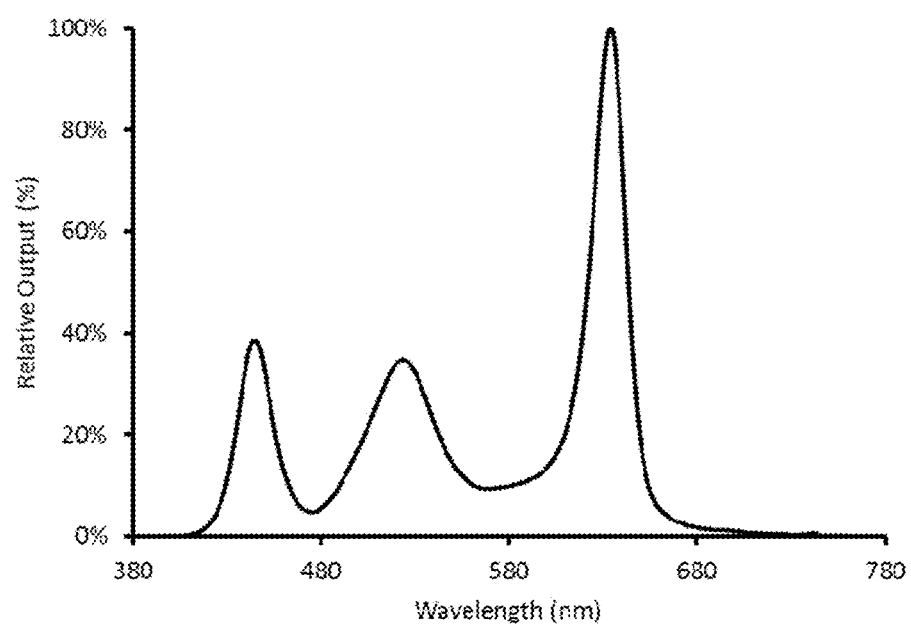
Figure 7I:
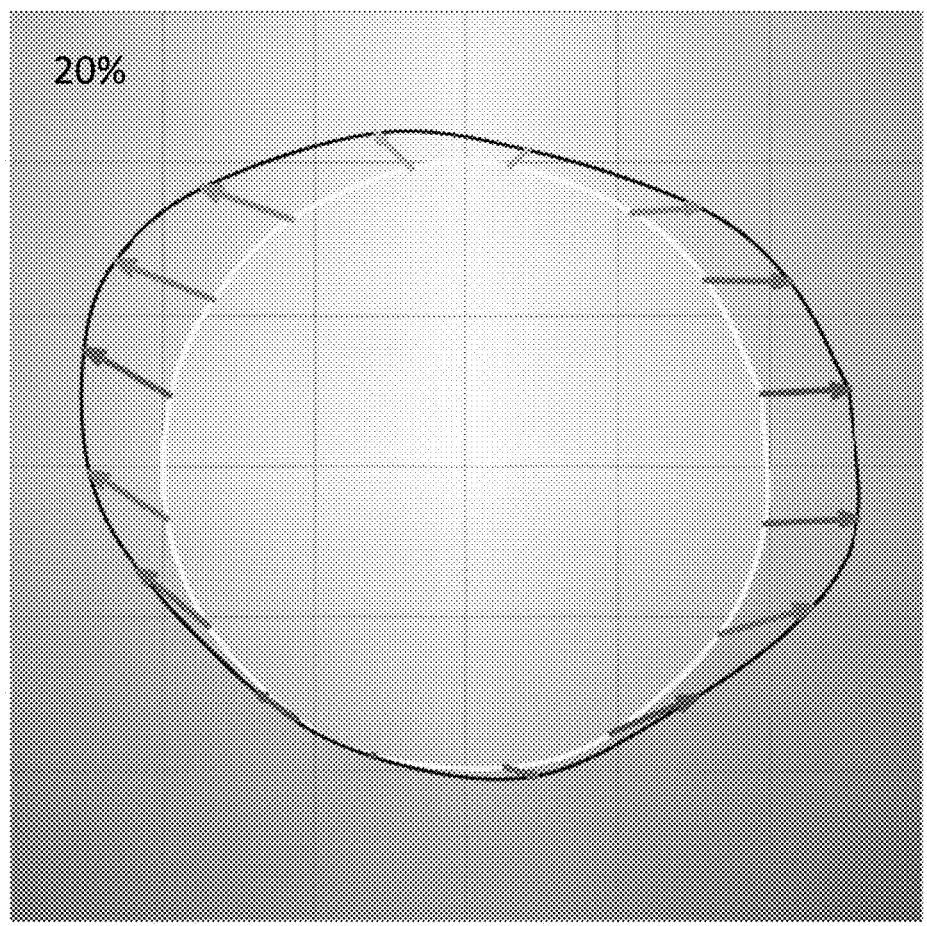
Figure 7I:
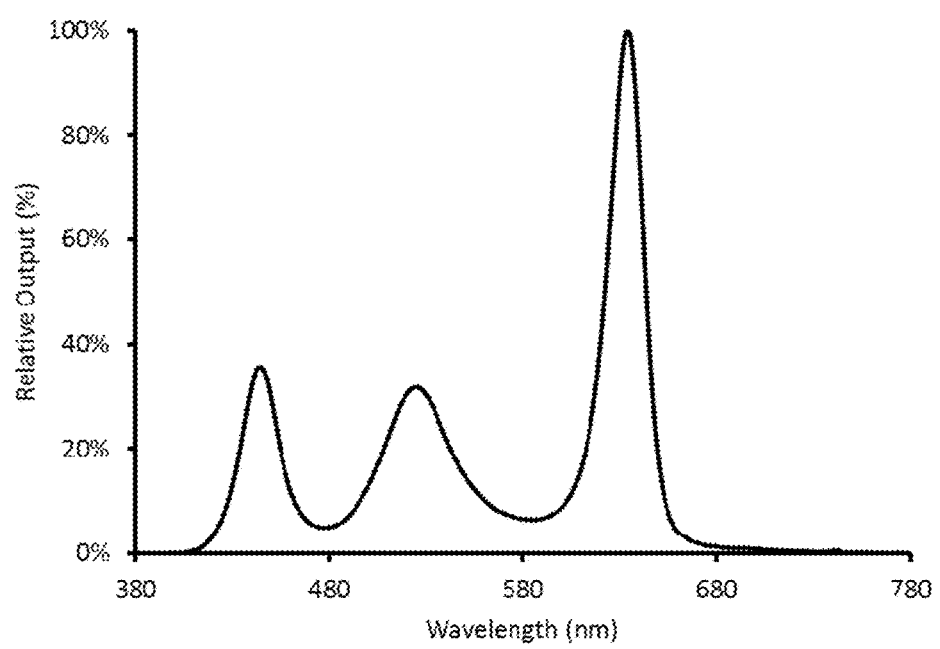
Figure 7J:
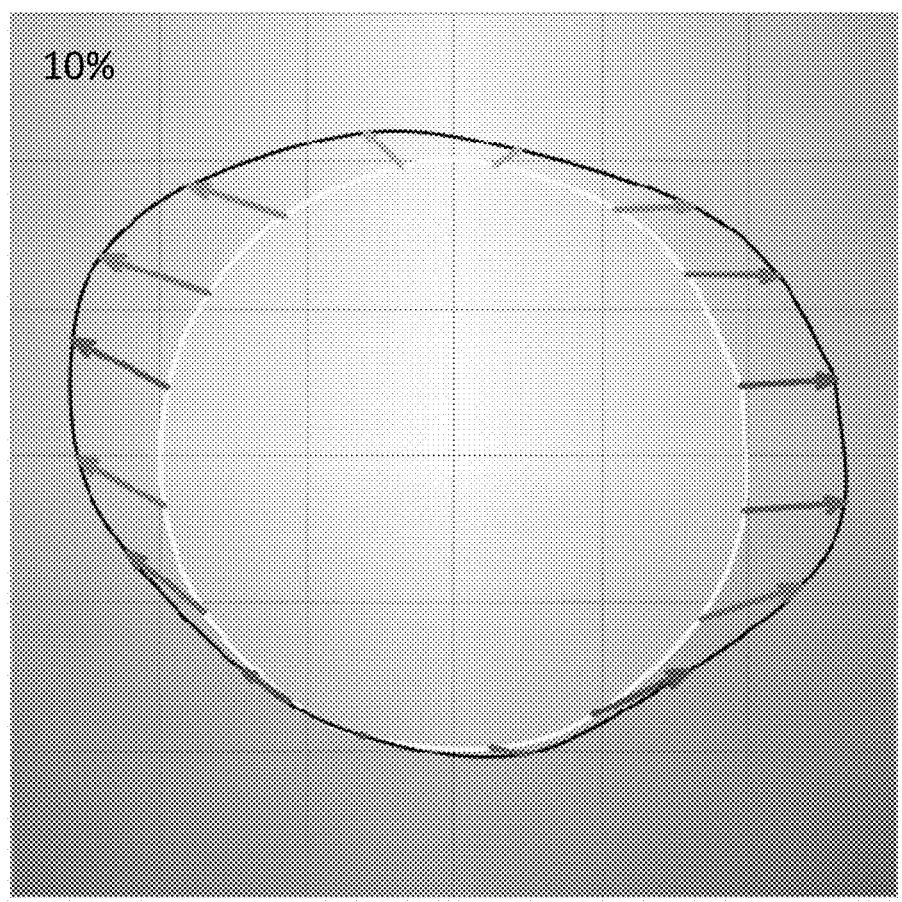
Figure 7J:
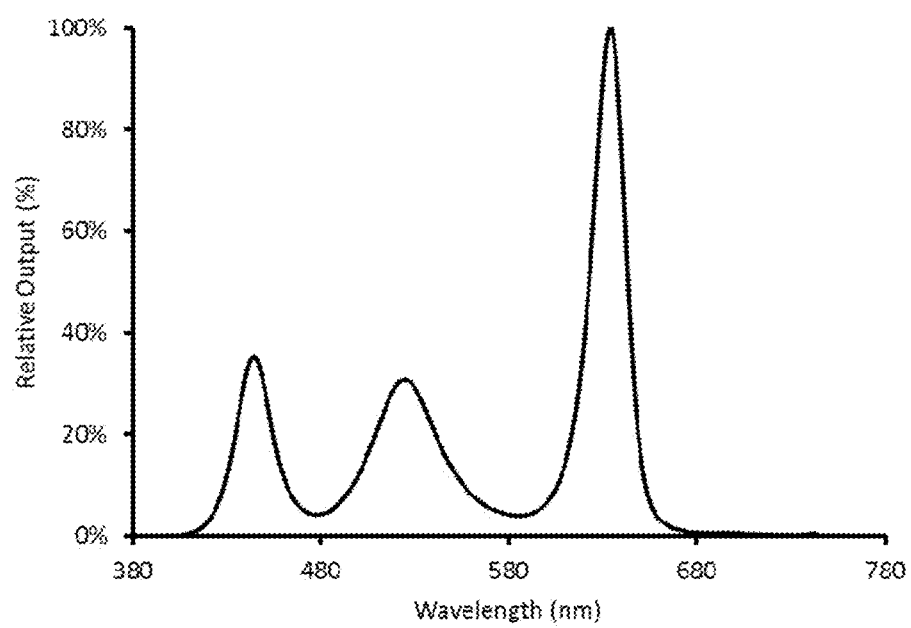
Figure 7K:
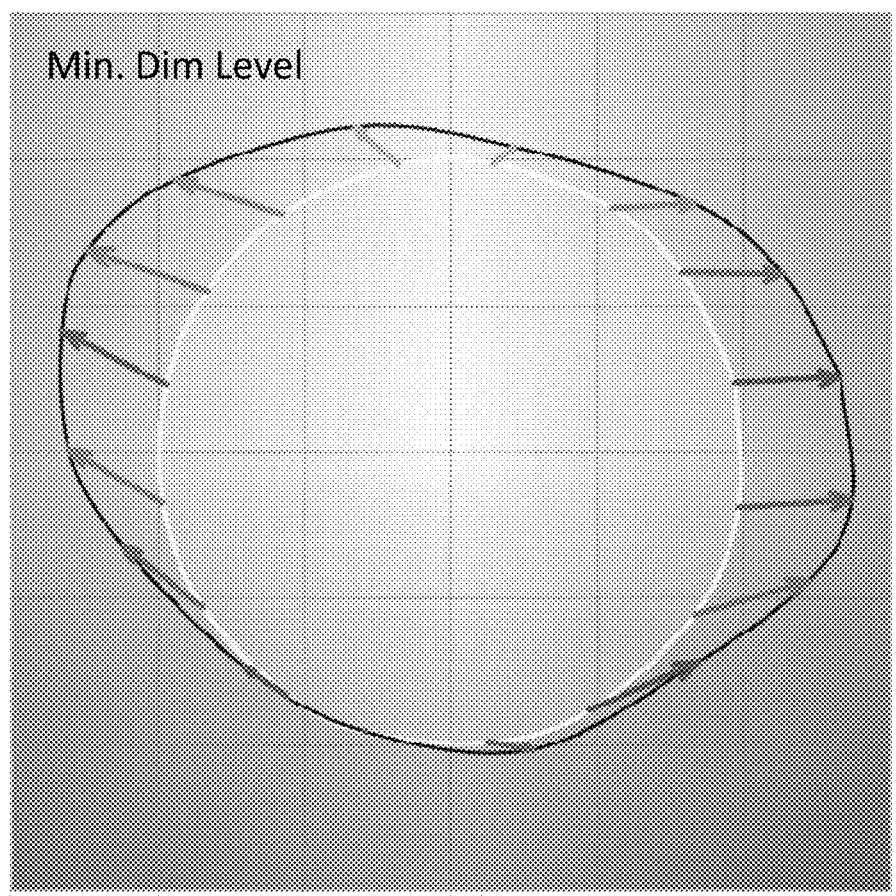
Figure 7K:
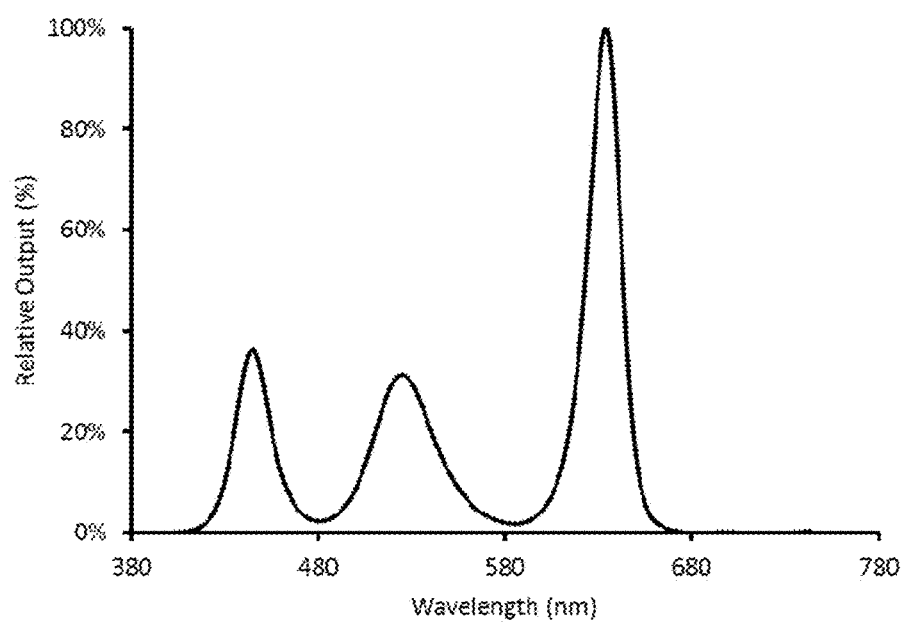

With reference now to FIGS. 6A and 6D, fractional (i.e. relative) percentages of each of the seven LED channels are used to create systematic variations in color characteristics. They are adjusted for lumen output based on the array of 22 LED emitters described in FIGS. 4B and 5B. In this example CCT is held constant at 3500 K. The IES TM-30-15 fidelity index (Rf) changes linearly from 96 at full output to 48 at the minimum dimmed level. The IES TM-30-15 gamut index (Rg) changes linearly from 101 to 140. Duv changes linearly from 0.0 to −0.03. IES TM-30-15 chroma shift in hue bin one (Rcs,h1), representing red saturation, varies linearly from −0.001 (−0.1%) to +0.354 (+35.4%). Relative DMX (digital multiplex) values associated with the fractional values given in FIG. 6A are shown in FIG. 6B. These DMX values have been adjusted for lumen output. With reference now to the example shown in FIG. 6C, systematic changes in Rf, Rg, CCT, Duv, and Rcs,h1 are shown from full output to the minimum dimmed level in 10% increments. CCT was held constant and luminous efficacy of radiation (LER) is shown for reference.

FIGS. 7A-7K, provide TM-30-15 Color Vector Graphics (CVGs) [top] and associated Spectral Power Distributions (SPDs) [bottom] for dimming from full output to minimum dim level in increments of 10 percent. The CVGs are divided into 16 hue bins, each represented by a point and representing the average of the TM-30-15 hue samples taken in that radial section of the hue graph. The vectors represent the difference in hue and saturation of each bin between the test illuminant (dark circle) and a reference illuminator (white circle). Vectors of increasing distance from the center represent an increase in saturation, vectors decreasing distance to the center represent a decrease in saturation. The component of each vector tangent to the reference illuminator circle represents a hue shift in that hue bin. The Rg is determined by the difference in the area enclosed by the polygons defined by the test illuminant points and the reference illuminator points, where Rg=100 represents a match with the reference illuminator.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

What is claimed is:

1. A method of increasing the color gamut of a multi-emitter light emitting device when dimming, comprising:
   independently driving each emitter in the device;
   increasing the lumen output of at least one emitter while simultaneously decreasing the lumen output of at least one other emitter, such that total color gamut increases while total lumen output of the light emitting device decreases; and
   linearly increasing an IES TM-30-15 gamut index (Rg) as lumen output decreases.

2. The method of claim 1, wherein the plurality of LED emitters includes at least 7 LED emitters, the at least 7 LED emitters comprising a red emitter, a lime emitter, an amber emitter, a green emitter, a cyan emitter, a blue emitter and an indigo emitter.

3. The method of claim 1 further comprising:
   linearly decreasing a distance Duv as lumen output decreases.

4. The method of claim 1, wherein the plurality of LED emitters includes at least 4 LED emitters, the at least 4 LED emitters comprising a red emitter, a green emitter, a royal blue (indigo) emitter, and a white emitter.

5. The method of claim 1 further comprising:
   maintaining a constant correlated color temperature as lumen output decreases.

6. The method of claim 1, wherein the plurality of LED emitters includes at least 5 LED emitters, the at least 5 LED emitters comprising a red emitter, a lime emitter, a green emitter, a cyan emitter, and a royal blue (indigo) emitter.

7. The method of claim 1 further comprising:
   linearly increasing the IES TM-30-15 gamut index (Rg) from about 101 at full output to about 140 at minimum dimmed level.

8. A method of increasing the color gamut of a multi-emitter light emitting device when dimming, comprising:
   independently driving each emitter in the device;
   increasing the lumen output of at least one emitter while simultaneously decreasing the lumen output of at least one other emitter, such that total color gamut increases while total lumen output of the light emitting device decreases; and
   linearly decreasing an IES TM-30-15 fidelity index (Rf) as lumen output decreases.

9. A light emitting device comprising:
   at least 2 LED emitters;
   at least one internal controller;
   a plurality of driver circuits configured to independently drive the plurality of LED emitters via the at least one internal controller;
   programming logic configured to increase the lumen output of at least one emitter while simultaneously decreasing the lumen output of at least one other emitter, such that total color gamut increases while total lumen output of the light emitting device decreases; and wherein the light emitting device is further configured to linearly increase an IES TM-30-15 gamut index (Rg) as lumen output decreases.

10. The light emitting device of claim 9, wherein each of the at least 2 LED emitters are configured to emit a different color.

11. The light emitting device of claim 9, wherein the at least 2 LED emitters are selected from the group consisting of a red emitter, a lime emitter, an amber emitter, a green emitter, a cyan emitter, a blue emitter, an indigo emitter, and a white emitter.

12. The light emitting device of claim 9, wherein the light emitting device is further configured to linearly increase the IES TM-30-15 gamut index (Rg) from about 101 at full output to about 140 at minimum dimmed level.

13. The light emitting device of claim 9, wherein the light emitting device is further configured to increase the IES TM-30-15 gamut index (Rg) to at least 120 at a 50% dimmed level.

14. The light emitting device of claim 9, wherein each of the plurality of LED emitters comprises an LED die.

15. The light emitting device of claim 9, wherein the plurality of LED emitters are arranged in a single LED package.

16. The light emitting device of claim 9, wherein the light emitting device is a luminaire.

17. The light emitting device of claim 9, further comprising an external controller interface communicatively connected to an external controller and the internal controller.

* * * * *